ns(12) United States Patent
Hayashi (10) Patent No.: US 10,374,613 B2
(45) Date of Patent: Aug. 6, 2019

(54) OSCILLATOR, ELECTRONIC APPARATUS, AND VEHICLE

(71) Applicant: SEIKO EPSON CORPORATION, Tokyo (JP)

(72) Inventor: Kenji Hayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 238 days.

(21) Appl. No.: 15/462,165

(22) Filed: Mar. 17, 2017

(65) Prior Publication Data

US 2017/0279452 A1    Sep. 28, 2017

(30) Foreign Application Priority Data

Mar. 25, 2016 (JP) ................. 2016-061852

(51) Int. Cl.
*H03B 5/32* (2006.01)
*H03B 5/36* (2006.01)
*H03L 1/02* (2006.01)
*H03L 1/04* (2006.01)
*H01L 27/20* (2006.01)

(52) U.S. Cl.
CPC .............. *H03L 1/026* (2013.01); *H01L 27/20* (2013.01); *H03B 5/32* (2013.01); *H03B 5/366* (2013.01); *H03L 1/04* (2013.01)

(58) Field of Classification Search
CPC ..... H03L 1/02; H03L 1/04; H03L 1/00; H03L 1/026; H03B 5/366; H03B 5/32; H01L 27/20
USPC .................................. 331/176, 158, 116 FE
See application file for complete search history.

(56) References Cited

U.S. PATENT DOCUMENTS 5,659,270 A * 8/1997 Millen .................... H03L 1/028
310/315
7,876,167 B1 * 1/2011 McCraith ............. H03H 9/2426
331/116 M

FOREIGN PATENT DOCUMENTS

JP    2011-101212 A    5/2011
JP    2014-192578 A    10/2014

* cited by examiner

*Primary Examiner* — Arnold M Kinkead
(74) *Attorney, Agent, or Firm* — Oliff PLC (57) ABSTRACT

An oscillator includes an oscillation circuit, an operation state signal generation circuit that generates an operation state signal based on an operation state of the oscillation circuit, and a first integrated circuit, the oscillation circuit and the operation state signal generation circuit are disposed outside the first integrated circuit, and the first integrated circuit includes a first digital interface circuit, a D/A conversion circuit that converts a digital signal input via the first digital interface circuit into an analog signal to generate a frequency control signal that controls a frequency of the oscillation circuit, and a terminal to which the operation state signal is input.

14 Claims, 7 Drawing Sheets

OSCILLATOR, ELECTRONIC APPARATUS, AND VEHICLE

CROSS-REFERENCE TO RELATED APPLICATIONS

This application claims priority to Japanese Patent Application No. 2016-061852, filed Mar. 25, 2016, the entirety of which is hereby incorporated by reference.

BACKGROUND

1. Technical Field

Various embodiments of the present invention relates to an oscillator, an electronic apparatus, and a vehicle.

2. Related Art

A crystal oscillator, which is used for a reference frequency signal source for communication equipment, a measurement instrument, or the like, is required to have the output frequency stable with high accuracy with respect to a change in temperature. In general, there is known an oven controlled crystal oscillator (OCXO) as a crystal oscillator, with which extremely high frequency stability can be obtained, among crystal oscillators. Further, in recent years, an improvement in characteristic of the temperature compensated crystal oscillator (TCXO) is remarkable, and the TCXO having frequency accuracy and frequency stability close on those of the OCXO is under development.

Such an oscillator high in accuracy is used for, for example, a base station of cellular phones, and is required to be able to control the frequency with digital control in some cases. For example, in Japanese patent application JP-A-2011-101212, there is disclosed a piezoelectric oscillator, which has a D/A (Digital to Analog) converter, a resonator, and an oscillation loop, and the frequency output from which can be changed by changing the input signal to the D/A converter.

Further, in the case of the oven controlled crystal oscillator (OCXO) used in the base station or the like, there is required to output information such as an oven alarm signal, which represents the fact that the temperature has been stabilized and the oscillator has become available, in addition to the oscillation signal in some cases. For example, in JP-A-2014-192578, there is disclosed an oscillation device including an oscillator attached with an oven, which informs the outside of the fact that the oscillation frequency of the oscillation device has been stabilized after powered on.

However, in the case in which the D/A converter and the oscillation circuit are integrated into the same IC as in the case of the oscillator described in JP-A-2011-101212 in order to miniaturize the oscillator, there is a possibility that the noise caused by a communication signal as a digital signal gets mixed in the oscillation circuit through a roundabout way to deteriorate the noise characteristic of the oscillation signal.

SUMMARY

An advantage of some aspects of the invention is to provide an oscillator capable of reducing the possibility that the noise characteristic of the oscillation signal is deteriorated by the communication signal. Another advantage of some aspects of the invention is to provide an electronic apparatus and a vehicle using the oscillator.

The invention can be implemented as the following aspects or application examples.

APPLICATION EXAMPLE 1

An oscillator according to this application example includes an oscillation circuit, an operation state signal generation circuit adapted to generate an operation state signal based on an operation state of the oscillation circuit, and a first integrated circuit, the oscillation circuit and the operation state signal generation circuit are disposed outside the first integrated circuit, and the first integrated circuit includes a first digital interface circuit, a D/A conversion circuit adapted to convert a digital signal input via the first digital interface circuit into an analog signal to generate a frequency control signal adapted to control a frequency of the oscillation circuit, and a terminal to which the operation state signal is input.

The oscillation circuit may be a variety of types of oscillation circuit such as a pierce oscillator circuit, an inverter type oscillation circuit, a Colpitts oscillator circuit, a Hartley oscillator circuit, or an LC oscillation circuit.

The operation state signal based on the operation state of the oscillation circuit may be, for example, a signal representing whether or not the frequency of the oscillation signal output from the oscillation circuit has been stabilized, or can also be a signal representing whether or not the temperature of the element included in the oscillation circuit has been stabilized.

According to the oscillator related to this application example, since the oscillation circuit is disposed outside the first integrated circuit, it is hard for the noise caused by the digital signal (the communication signal) for controlling the frequency input via the first digital interface circuit of the first integrated circuit to get mixed in the oscillation circuit through a roundabout way. Therefore, according to the oscillator related to the present application example, it is possible to reduce the possibility that the noise characteristic of the oscillation signal is deteriorated by the communication signal.

Further, according to the oscillator related to this application example, since the first integrated circuit has a terminal to which the operation state signal is input, it is possible to output the operation state signal to the outside via the first integrated circuit.

APPLICATION EXAMPLE 2

In the oscillator according to the application example described above, the first integrated circuit may output a signal based on the operation state signal via the first digital interface circuit.

According to the oscillator related to this application example, since the oscillation circuit is disposed outside the first integrated circuit, it is hard for the noise caused by the digital signal (the communication signal) for requesting the output of the operation state signal input via the first digital interface circuit of the first integrated circuit and the noise caused by a signal (e.g., the digital signal corresponding to the operation state signal) based on the operation state signal output via the first digital interface circuit to get mixed in the oscillation circuit through a roundabout way. Therefore, according to the oscillator related to the present application example, it is possible to reduce the possibility that the noise characteristic of the oscillation signal is deteriorated by the communication signal.

Further, according to the oscillator related to this application example, since the first digital interface circuit of the first integrated circuit can also be used for the output of the operation state signal, there is an advantage to the miniaturization.

APPLICATION EXAMPLE 3

The oscillator according to the application example described above may further include a resonator, and the oscillation circuit may oscillate the resonator.

According to this application example, for example, in the oscillator such as a quartz crystal oscillator, it is possible to reduce the possibility that the noise characteristic of the oscillation signal is deteriorated by the communication signal.

APPLICATION EXAMPLE 4

In the oscillator according to the application example described above, the operation state signal may be a signal representing whether or not temperature of the resonator is in a predeterimned state.

According to the oscillator related to this application example, it is possible to inform the outside of whether or not the temperature of the resonator is in a predetermined state (e.g., whether or not the temperature of the resonator is in a stable state, or whether or not the temperature of the resonator is in a state of having reached the preset value).

APPLICATION EXAMPLE 5

The oscillator according to the application example described above may further include a temperature control element adapted to control temperature of the resonator.

According to this application example, for example, in the oscillator such as an oven controlled oscillator (OCXO), it is possible to reduce the possibility that the noise characteristic of the oscillation signal is deteriorated by the communication signal.

APPLICATION EXAMPLE 6

The oscillator according to the application example described above may further include a first substrate on which the first integrated circuit is mounted, the first substrate may include a digital interconnection electrically connected to the first digital interface circuit, and a shield pattern, and at least a part of the shield pattern may overlap the digital interconnection in a planar view of the first substrate.

According to the oscillator related to this application example, since the first substrate has the shield pattern overlapping the digital interconnection in at least a part thereof, the noise generated by the digital signal (the communication signal) propagating through the digital interconnection becomes hard to be radiated to the periphery of the first substrate due to the shield effect of the shield pattern. Therefore, according to the oscillator related to the present application example, since it is hard for the noise caused by the digital signal (the communication signal) to get mixed in the oscillation circuit through a roundabout way, it is possible to reduce the possibility that the noise characteristic of the oscillation signal deteriorates.

APPLICATION EXAMPLE 7

The oscillator according to the application example described above may further include a second substrate on which at least a part of the oscillation circuit and at least a part of the operation state signal generation circuit are mounted.

According to the oscillator related to this application example, since at least a part of the oscillation circuit and at least a part of the operation state signal generation circuit are mounted on the second substrate separated from the first substrate on which the first integrated circuit is mounted, it is hard for the noise generated by the digital signal (the communication signal) propagating through the digital interconnection disposed on the first substrate to get mixed in the oscillation circuit through a roundabout way, and it is possible to reduce the possibility that the noise characteristic of the oscillation signal deteriorates.

APPLICATION EXAMPLE 8

In the oscillator according to the application example described above, the second substrate maybe disposed between the resonator and the first substrate.

According to the oscillator related to this application example, since the interconnection connecting the resonator and the oscillation circuit mounted on the second substrate is shortened, the noise characteristic of the oscillation signal is improved, and since the interconnection connecting the operation state signal generation circuit mounted on the second substrate and the first integrated circuit mounted on the first substrate is shortened, there is an advantage to the miniaturization.

APPLICATION EXAMPLE 9

The oscillator according to the application example described above may further include a second integrated circuit including at least a part of the oscillation circuit and at least a part of the operation state signal generation circuit.

According to the oscillator related to this application example, since at least a part of the oscillation circuit and at least a part of the operation state signal generation circuit are integrated, there is an advantage to the miniaturization.

APPLICATION EXAMPLE 10

In the oscillator according to the application example described above, the second integrated circuit may include a second digital interface circuit, and a memory adapted to store information based on a digital signal input via the second digital interface circuit, and the operation state signal generation circuit and the second digital interface circuit may be electrically isolated from each other.

According to the oscillator related to this application example, the information for adjusting the characteristic is stored in the memory via the second digital interface circuit before the oscillation circuit starts the oscillation to thereby improve the characteristic of the oscillation signal, and there is no chance for the operation state signal to be read out via the second digital interface circuit after the oscillation circuit has started the oscillation. Therefore, it is possible to reduce the possibility that the noise characteristic of the oscillation signal is deteriorated by the noise caused by the communication signal.

APPLICATION EXAMPLE 11

The oscillator according to the application example described above may further include a first external terminal, and a second external terminal separated from the first external terminal, the second integrated circuit may include a second digital interface circuit, and a memory adapted to store information based on a digital signal input via the second digital interface circuit, the first digital interface circuit maybe electrically connected to the first external terminal, and the second digital interface circuit may be electrically connected to the second external terminal.

According to the oscillator related to this application example, for example, by storing the information for adjusting the characteristic in the memory via the second digital interface circuit using the second external terminal before the oscillation circuit starts the oscillation, it is possible to improve the characteristic of the oscillation signal. Further, after the oscillation circuit starts the oscillation, by arranging that the operation state signal is read out via the first digital interface circuit using the first external terminal, it is possible to reduce the possibility that the noise characteristic of the oscillation signal is deteriorated by the noise caused by the communication signal since there is no chance for the operation state signal to be read out via the second digital interface circuit using the second external terminal.

APPLICATION EXAMPLE 12

An electronic apparatus according to this application example includes any one of the oscillators described above.

APPLICATION EXAMPLE 13

A vehicle according to this application example includes any one of the oscillators described above.

According to these application examples, since there is provided the oscillator capable of reducing the possibility that the noise characteristic of the oscillation signal is deteriorated by the communication signal, for example, electronic apparatus and vehicle of reliability can also be realized.

BRIEF DESCRIPTION OF THE DRAWINGS

Various embodiments of the invention will now be described with reference to the accompanying drawings, wherein like numbers reference like elements.

DESCRIPTION OF EXEMPLARY EMBODIMENTS

Various embodiments of the invention will hereinafter be described in detail using the accompanying drawings. It should be noted that the embodiments described below do not unreasonably limit the content of the invention as set forth in the appended claims. Further, all of the constituents described below are not necessarily essential elements of the embodiments.

1. Oscillator 1-1. First Embodiment

Figure 1:
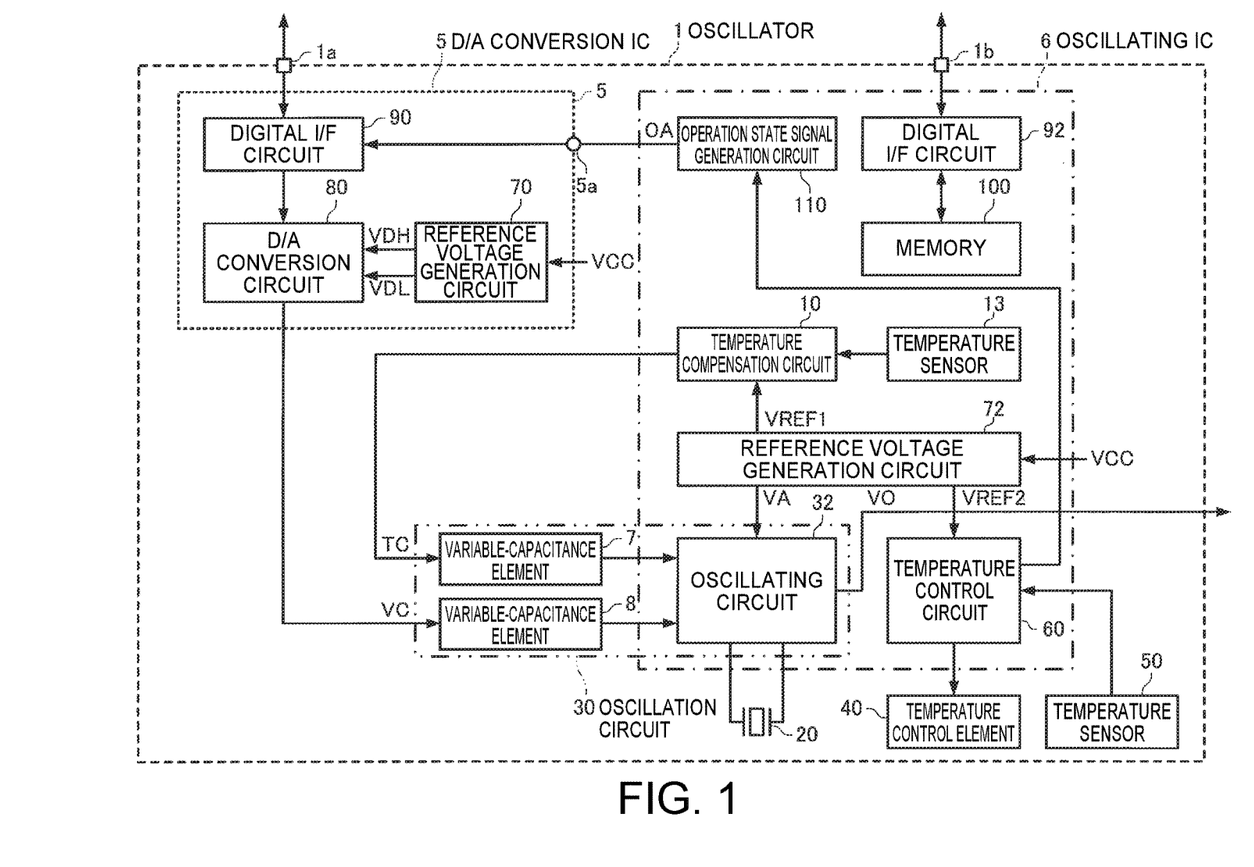
FIG. 1 is a functional block diagram of an oscillator according to first embodiment.

FIG. 1 is an example of a functional block diagram of the oscillator according to the first embodiment. As shown in FIG. 1, the oscillator 1 according to the first embodiment is configured including a resonator 20, a D/A conversion integrated circuit (IC) 5 (an example of a first integrated circuit), an oscillating integrated circuit (IC) 6 (an example of a second integrated circuit), a variable capacitance element 7, a variable capacitance element 8, a temperature control element 40, and a temperature sensor 50. It should be noted that the oscillator 1 according to the present embodiment can be provided with a configuration obtained by eliminating or modifying some of the constituents shown in FIG. 1, or adding other constituents.

As shown in FIG. 1, the D/A conversion IC 5 is configured including a reference voltage generation circuit 70, a D/A conversion circuit 80, and a digital interface circuit 90 (an example of a first digital interface circuit). It should be noted that it is also possible for the D/A conversion IC 5 to have a configuration obtained by eliminating or modifying some of these constituents, or adding other constituents.

The digital interface circuit 90 is electrically connected to an external terminal 1a (a first external terminal) of the oscillator 1, obtains a signal (a signal including digital data for controlling the frequency of an oscillation circuit 30) input from the external terminal 1a, then converts the signal into N-bit data signal, and then output the data signal to the D/A conversion circuit 80.

The reference voltage generation circuit 70 generates a high-potential-side reference voltage VDH and a low-potential-side reference voltage VDL based on a power supply voltage VCC supplied from the outside (the outside of the oscillator 1) of the D/A conversion IC 5.

The D/A conversion circuit 80 converts the digital signal input via the digital interface circuit 90 into an analog signal to generate a frequency control signal for controlling the frequency of the oscillation circuit 30. Specifically, the N-bit data signal (the digital data for controlling the frequency of the oscillation circuit 30) output by the digital interface circuit 90 is input to the D/A conversion circuit 80, and the D/A conversion circuit 80 converts the N-bit data signal into an analog signal having a voltage between the high-potential-side reference voltage VDH and the low-potential-side reference voltage VDL, and then outputs the result. As the D/A conversion circuit 80, there can be used a variety of types such as a well-known resistance voltage dividing type (also called a voltage dividing type, a resistor string type, or a voltage potentiometer type), a resistance ladder type (e.g., R-2R ladder type), a capacitance array type, and a delta sigma type.

The voltage (control voltage) VC of the analog signal output by the D/A conversion circuit 80 is added to a variable-capacitance element 8 disposed outside the D/A conversion IC 5, and the capacitance value of the variable-capacitance element 8 varies in accordance with the control voltage VC. The variable-capacitance element 8 can also be, for example, a varicap diode (a varactor) varied in capacitance value in accordance with the control voltage VC applied to one end.

As shown in FIG. 1, an oscillating IC 6 is configured including a temperature compensation circuit 10, a temperature sensor 13, an oscillating circuit 32, a temperature control circuit 60, a reference voltage generation circuit 72, a digital interface circuit 92 (an example of a second digital interface circuit), a memory 100, and an operation state signal generation circuit 110. It should be noted that it is also possible for the oscillating IC 6 to have a configuration obtained by eliminating or modifying some of these constituents, or adding other constituents.

The temperature compensation circuit 10 is connected to the temperature sensor 13, and generates a temperature compensation voltage TC, which is for correcting the frequency-temperature characteristic of the output signal of the oscillation circuit 30, in accordance output signal of the temperature sensor 13.

The temperature sensor 13 is for, for example, outputting a voltage corresponding to the ambient temperature of the temperature sensor 13, and can be a positive type, in which the higher the temperature is, the higher the output voltage is, or can also be a negative type, in which the higher the temperature is, the lower the output voltage is.

The temperature compensation voltage TC output by the temperature compensation circuit 10 is applied to a variable-capacitance element 7 disposed outside the oscillating IC 6, and the capacitance value of the variable-capacitance element 7 caries in accordance with the temperature compensation voltage TC. The variable-capacitance element 7 can also be, for example, a varicap diode (a varactor) varied in capacitance value in accordance with the temperature compensation voltage TC applied to one end.

The oscillating circuit 32 constitutes the oscillation circuit 30 for oscillating the resonator 20 together with the variable-capacitance element 7, the variable-capacitance element 8, and other electronic components (not shown) externally attached to the terminals of the oscillating IC 6. Therefore, although in the present embodiment, the oscillating IC 6 has the oscillating circuit 32 as a part of the oscillation circuit 30, it is also possible to adopt a configuration in which the oscillating IC 6 has at least a part of the oscillation circuit 30, for example, a configuration in which the oscillating IC 6 has the whole of the oscillation circuit 30.

The oscillation circuit 30 oscillates the resonator 20 with the frequency corresponding to the capacitance value of the variable-capacitance element 7 and the capacitance value of the variable-capacitance element 8 to output an oscillation signal VO. The oscillation signal VO output by the oscillation circuit 30 is output to the outside (the outside of the oscillator 1) of the oscillating IC 6.

As the resonator 20, it is possible to use, for example, an SC-cut, AT-cut, or BT-cut quartz crystal resonator or a surface acoustic wave (SAW) resonator. Further, a piezoelectric resonator other than crystal resonators or an MEMS (micro electromechanical systems) resonator, for example, can also be used as the resonator 20. As a substrate material of the resonator 20, there can be used, for example, a piezoelectric single crystal such as a quartz crystal, lithium tantalate, or lithium niobate, a piezoelectric material such as piezoelectric ceramics including, for example, lead zirconate titanate, or a silicon semiconductor material. Further, as an excitation device of the resonator 20, there can be used a device using a piezoelectric effect, or electrostatic drive using a Coulomb force.

The resonator 20 is housed in a thermostatic oven (also referred to as an "oven") not shown. As described later, a housing chamber 2c shown in FIG. 6 corresponds to the thermostatic oven (the oven).

The temperature control circuit 60 is disposed near to the resonator 20, and controls the operation of the temperature control element 40 for controlling the temperature of the resonator 20 based on the output voltage of the temperature sensor 50 for detecting the temperature of the resonator 20 (the temperature of the thermostatic oven). Specifically, the temperature control circuit 60 controls the operation of the temperature control element 40 in accordance with the output voltage of the temperature sensor so as to keep the temperature of the resonator 20 constant.

As the temperature control element 40, it is also possible to use, for example, a heating element (e.g., a power transistor or a resistor) for generating heat by making a current flow through the heating element, or a heat absorbing element (e.g., a Peltier element). Further, as the temperature sensor 50, there can be used, for example, a thermistor (e.g., an NTC (negative temperature coefficient) thermistor or a PTC (positive temperature coefficient) thermistor), or a platinum resistor.

For example, the temperature sensor 50 having a positive temperature characteristic is disposed in the vicinity of the resonator 20 in advance, and it is possible for the temperature control circuit 60 to perform the control so as to make the current flow through the temperature control element 40 to generate heat when the output voltage of the temperature sensor 50 is lower than a reference value, and to stop making the current flow through the temperature control element 40 when the output voltage of the temperature sensor 50 is higher than the reference value.

The reference voltage generation circuit 72 generates a power supply voltage VA of the oscillation circuit 30, a reference voltage VREF1 of the temperature compensation circuit 10, a reference voltage VREF2 of the temperature control circuit 60, and so on based on the power supply voltage VCC supplied from the outside (the outside of the oscillator 1) of the oscillating IC 6.

The memory 100 stores the information based on the digital signal input via the digital interface circuit 92. For example, the memory 100 is configured including a nonvolatile memory and a register not shown, and the nonvolatile memory stores configuration information of the temperature compensation circuit 10. The nonvolatile memory can be realized by a flash memory such as an MONOS (metal-oxide-nitride-oxide-silicon) memory, an electrically erasable programmable read-only memory (EEPROM), or the like.

Each of the configuration information stored in the nonvolatile memory is transferred from the nonvolatile memory to the register when powering on (when the power supply voltage VCC rises from 0 V to a prescribed voltage) the oscillating IC 6, and is then held in the register. Then, the configuration information held in the register is supplied to the temperature compensation circuit 10 and so on.

The digital interface circuit 92 is electrically connected to an external terminal 1b (a second external terminal) different from the external terminal 1a of the oscillator 1, obtains the signal input from the external terminal 1b, and then performs read/write with respect to the memory 100 (the nonvolatile memory and the register). The digital interface circuit 92 can be an interface circuit compatible with I²C (Inter-Integrated Circuit) bus, or, or can also be an interface circuit compatible with SPI (Serial Peripheral Interface) bus.

The operation state signal generation circuit 110 generates an operation state signal based on the operation state of the oscillation circuit 30. In the example shown in the drawings, as the operation state signal, the operation state signal generation circuit 110 generates an oven alarm signal OA representing whether or not the temperature of the resonator 20 is in the predetermined state based on the signal from the temperature control circuit 60. Here, the predetermined state can be a state in which, for example, the temperature of the resonator 20 is stable, or can also be a state in which the temperature has reached a preset value. The temperature of the resonator 20 can be determined based on the output voltage of the temperature sensor 50, or can also be determined based on the control voltage of the temperature control element 40. The operation state signal based on the operation state of the oscillation circuit 30 is not limited to the oven alarm signal OA, but the operation state signal generation circuit 110 can also generate, for example, a signal representing whether or not the frequency of the oscillation signal VO output from the oscillation circuit 30 has been stabilized. Further, it is also possible for the operation state signal generation circuit 110 to generate a signal representing the fact that the oscillation circuit 30 has become available based on the amplitude of the oscillation signal VO output from the oscillation circuit 30 or the elapsed time from when the oscillation 1 has started up.

Although in the present embodiment, the oscillating IC 6 has the whole of the operation state signal generation circuit 110, there can also be adopted a configuration in which the oscillating IC 6 has at least a part of the operation state signal generation circuit 110.

As shown in FIG. 1, the oscillation circuit 30 (i.e., the oscillating circuit 32, the variable-capacitance element 7, the variable-capacitance element 8, and so on) is disposed outside the D/A conversion IC 5. Therefore, it is hard for the noise caused by the digital signal (the communication signal) for controlling the frequency input via the digital interface circuit 90 of the D/A conversion IC 5 to get mixed in the oscillation circuit 30 through a roundabout way, and thus there is reduced the possibility that the noise characteristic of the oscillation signal VO is deteriorated by the communication signal.

Further, the operation state signal generation circuit 110 is also disposed outside the D/A conversion IC 5, and the operation state signal (the oven alarm signal OA) generated by the operation state signal generation circuit 110 is output from the oscillating IC 6, and is then input to a terminal 5a of the D/A conversion IC 5. In other words, the D/A conversion IC 5 has the terminal 5a to which the operation state signal (the oven alarm signal OA) is input. Then, the D/A conversion IC 5 outputs the operation state signal (the oven alarm signal OA) to the outside via the digital interface circuit 90. Specifically, an external device such as a control device is electrically connected to the external terminal 1a of the oscillator 1, and when the digital interface circuit 90 obtains the command data, which is input to the external terminal 1a from the external device and requests output of the operation state signal (the oven alarm signal OA), the digital interface circuit 90 outputs the serial data signal (an example of a signal based on the operation state signal (the oven alarm signal OA)) including bit data corresponding to the voltage level (a high level or a low level) of the operation state signal (the oven alarm signal OA) at that moment to the external terminal 1a. It is possible for the external device to obtain the serial data signal output from the external terminal 1a to recognize the operation state of the oscillation circuit 30 of the oscillator 1.

Therefore, the external device such as the control device is not required to read out the serial data signal based on the operation state signal via the digital interface circuit 92 using the external terminal 1b of the oscillator 1, and is not required to electrically be connected to the external terminal 1b. The external terminal 1b is electrically connected to an inspection device in an inspection process of the oscillator 1, and is used by the inspection device for writing a variety of types of configuration information to the memory 100 via the digital interface circuit 92 before, for example, the external device such as the control device is connected to the external terminal 1a and the oscillator 1 starts oscillation.

It should be noted that it is not required for the operation state signal generation circuit 110 and the digital interface circuit 92 to electrically be connected to each other. In the case of adopting such a configuration, the external device becomes unable to read out the operation state signal (the oven alarm signal OA) via the digital interface circuit 92. Therefore, it results that the external device necessarily reads out the operation state signal (the oven alarm signal OA) via the digital interface circuit 90 of the D/A conversion IC 5, and it is hard also for the noise caused by the command data, which is input via the digital interface circuit 90 and requests output of the operation state signal (the oven alarm signal OA), and the noise caused by the serial data signal corresponding to the operation state signal (the oven alarm signal OA) output via the digital interface circuit 90 to get mixed in the oscillation circuit 30 through a roundabout way, and thus, there is reduced the possibility that the noise characteristic of the oscillation signal VO is deteriorated by the communication signal.

Figure 2:
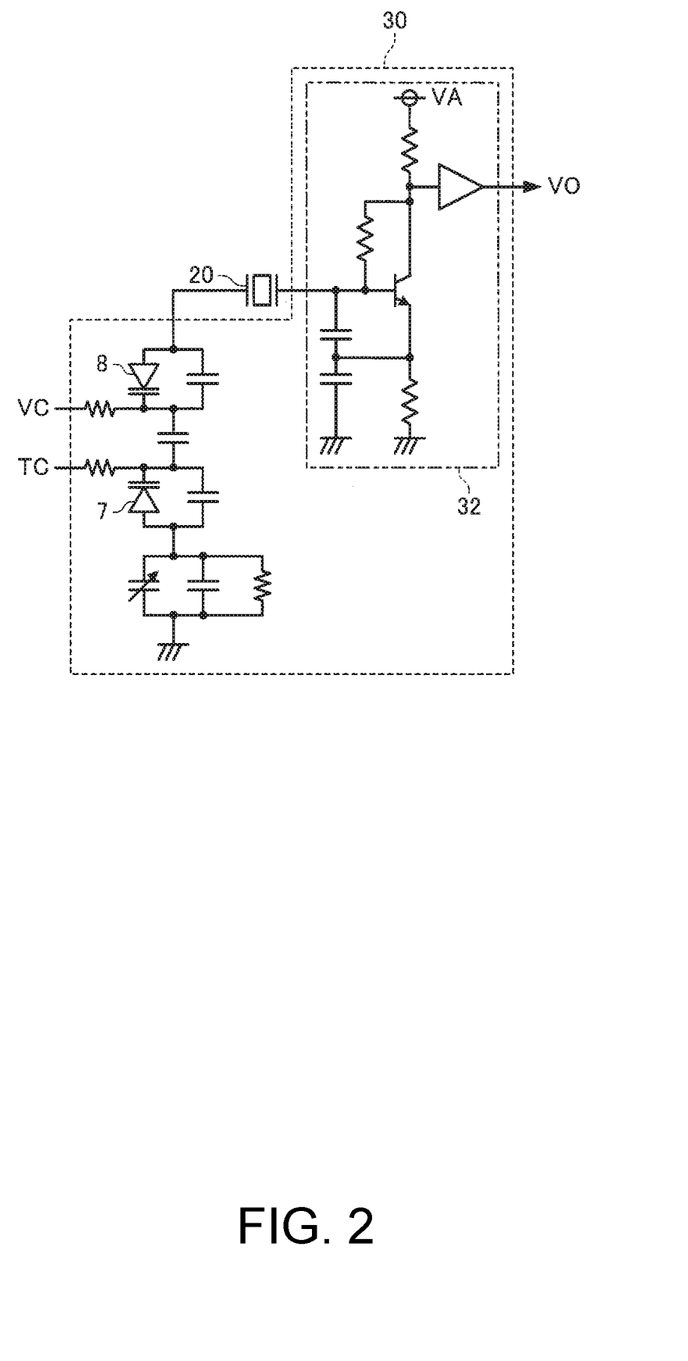
FIG. 2 is a diagram showing a configuration example of an oscillation circuit of the embodiment.

FIG. 2 is a diagram showing a configuration example of the oscillation circuit 30. In the oscillation circuit 30 shown in FIG. 2, the control voltage VC is applied to one end of the variable-capacitance element 8 (varicap diode), the capacitance value of the variable-capacitance element 8 varies in accordance with the voltage value, and thus, the oscillation frequency varies. Further, the temperature compensation voltage TC is applied to one end of the variable-capacitance element 7 (varicap diode), the capacitance value of the variable-capacitance element 7 varies in accordance with the voltage value, and thus the oscillation frequency is kept roughly constant irrespective of the temperature.

Figure 3:
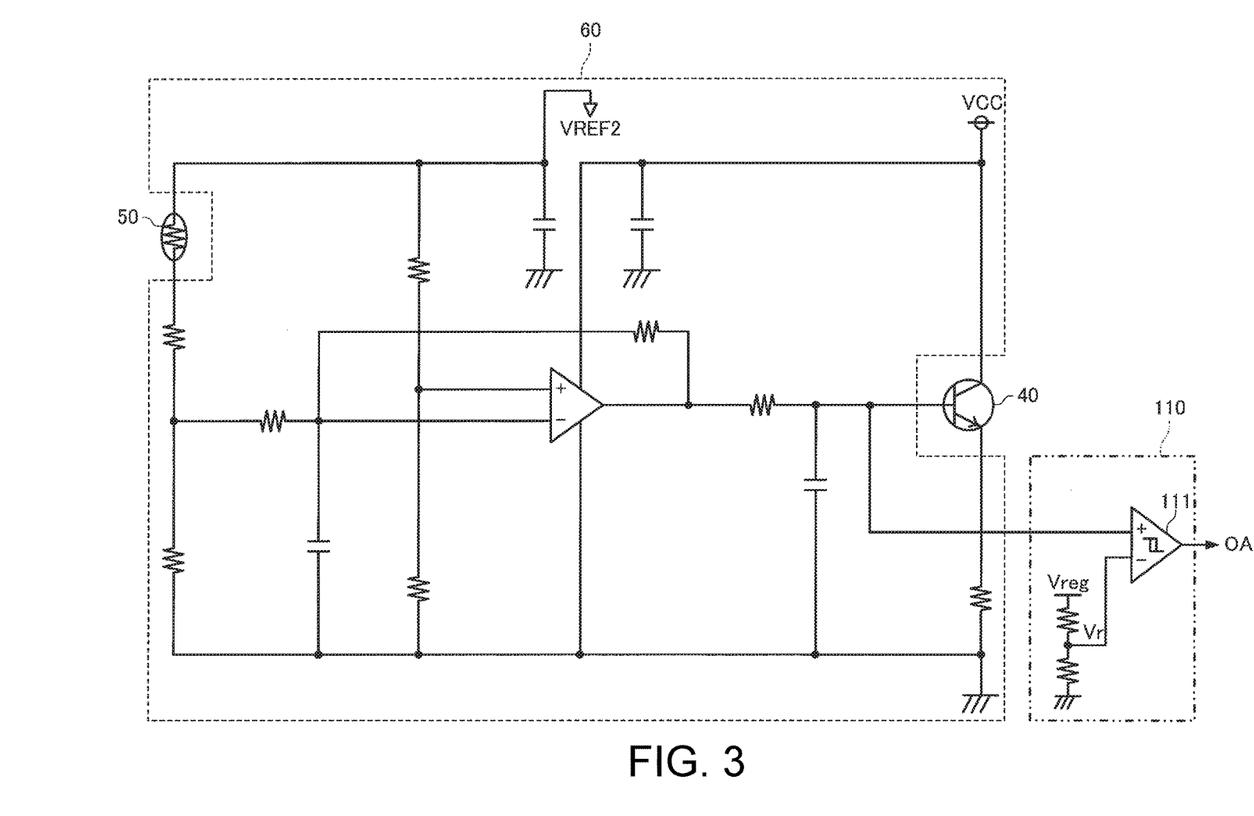
FIG. 3 is a diagram showing a configuration example of a temperature control circuit and an operation state signal generation circuit of the embodiment.

FIG. 3 is a diagram showing a configuration example of the temperature control circuit 60 and the operation state signal generation circuit 110. In FIG. 3, an NPN power transistor is used as the temperature control element 40, and an NTC thermistor is used as the temperature sensor 50. In the temperature control circuit 60 shown in FIG. 3, when the temperature drops, the resistance value of the temperature sensor 50 (the NTC thermistor) increases, and the input potential difference of the operational amplifier increases. In contrast, when the temperature rises, the resistance value of the temperature sensor 50 (the NTC thermistor) drops, and the input potential difference of the operational amplifier decreases. The output voltage of the operational amplifier is proportional to the input potential difference. In the temperature control element 40 (the NPN power transistor), when the output voltage of the operational amplifier is higher than a predetermined voltage value, the higher the output voltage is, the larger current flows to increase the amount of heat generation, and when the output voltage of the operational amplifier is lower than the predetermined voltage value, no current flows, and the amount of heat generation gradually decreases. Therefore, the operation of the temperature control element 40 is controlled so that the resistance value of the temperature sensor 50 (the NTC thermistor) becomes a predetermined value, namely so that a predetermined temperature is kept.

The operation state signal generation circuit 110 is provided with a comparator 111, and an input signal (an input signal to the base terminal of the NPN power transistor) of the temperature control element 40 is input to the non-inverting input terminal of the comparator 111. Further, to the inverting input terminal of the comparator 111, there is input a reference signal Vr generated by dividing a voltage between a reference voltage Vreg (e.g., generated by the reference voltage generation circuit 72) and the ground with resistors. For example, the voltage of the reference signal Vr is set so as to coincide with the voltage value of the input signal (the input signal to the base terminal of the NPN power transistor) of the temperature control element 40 at the moment when the temperature control element 40 (the NPN power transistor) is switched from ON to OFF, or from OFF to ON (the temperature (the temperature of the resonator 20) of the thermostatic oven coincides with a preset temperature). Then, the output signal of the comparator 111 is output to the outside of the oscillating IC 6 as the operation state signal (the oven alarm signal OA) representing whether or not the temperature of the resonator 20 has been stabilized.

It should be noted that it is also possible to arrange that the output signal of the temperature sensor 50 is input to the non-inverting input terminal of the comparator 111 instead of the input signal (the input signal to the base terminal of the NPN power transistor) of the temperature control element 40. In this case, for example, the voltage of the reference signal Vr input to the inverting input terminal of the comparator 111 is set so as to coincide with the output voltage value of the temperature sensor 50 at the moment when the temperature (the temperature of the resonator 20) of the thermostatic oven coincides with the preset temperature. Also in such a configuration, the output signal of the comparator 111 functions as the operation state signal (the oven alarm signal OA) representing whether or not the temperature of the resonator 20 has been stabilized.

In the case in which a read request command of the operation state signal (the oven alarm signal OA) has been input to the external terminal 1a of the oscillator 1 (the input terminal of the D/A conversion IC 5), the digital interface circuit 90 outputs the operation state signal (the oven alarm signal OA) to the external device via the external terminal 1a (the output terminal of the D/A conversion IC 5) of the oscillator 1. More specifically, in the case in which the operation state signal (the oven alarm signal OA) is in the high level, the operation state signal represents the fact that the temperature of the resonator 20 is not in the stable state (the temperature of the resonator 20 has not reached the preset temperature), and in the case in which the operation state signal (the oven alarm signal OA) is in the low level, the operation state signal represents the fact that the temperature of the resonator 20 is in the stable state (the temperature of the resonator 20 has reached the preset temperature).

In the oscillator 1 according to the present embodiment having such a configuration, the internal temperature of the thermostatic oven is controlled by the temperature control circuit 60 so as to be kept at a predetermined temperature (e.g., the temperature corresponding to a peak convex upward in the cubic curve of the frequency-temperature characteristic in the case in which the resonator 20 is the SC-cut quartz crystal resonator) based on the frequency-temperature characteristic of the output signal of the oscillation circuit 30 determined in accordance with the temperature characteristic of the resonator 20 and the IC (i.e., the D/A conversion IC 5 and the oscillating IC 6).

Figure 4:
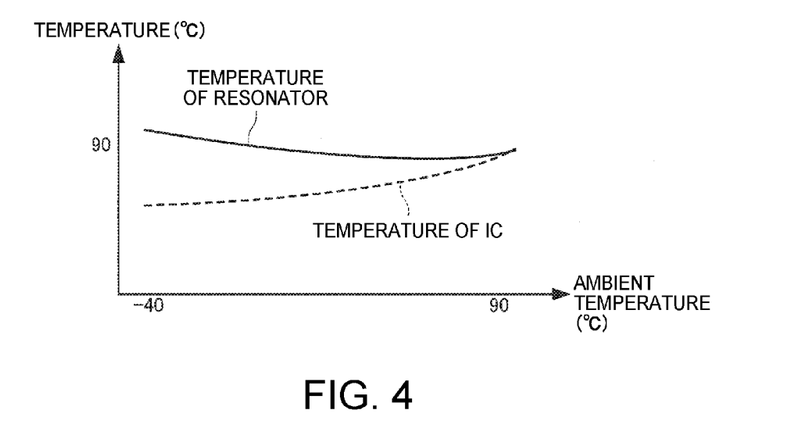
FIG. 4 is a diagram showing a change in temperature of a resonator and a change in temperature of an IC with respect to a change in ambient temperature.

However, in reality, the temperature in the thermostatic oven varies in accordance with the ambient temperature of the oscillator 1, and is therefore not constant. FIG. 4 is a diagram showing how the temperature of the resonator 20 changes and how the temperature of the IC (i.e., the D/A conversion IC 5 and the oscillating IC 6) changes due to the change in ambient temperature of the oscillator 1. For example, since the resonator 20 is close to the temperature control element 40 and at the same time housed in a container, the resonator 20 is hard to be affected by the ambient temperature, but the temperature of the resonator 20 also changes slightly if the ambient temperature changes in a range of −40° C. through 90° C. as shown in FIG. 4. Further, for example, the temperature of the IC (i.e., D/A conversion IC 5 and the oscillating IC 6) located at a place distant from the temperature control element 40 is easier to be affected by the ambient temperature than the resonator 20, and there is a tendency that the higher the ambient temperature is, the higher the temperature of the IC becomes.

In the present embodiment, the temperature compensation circuit 10 corrects the frequency deviation caused by the change in temperature of the resonator and the change in temperature of the IC due to the change in ambient temperature. In particular, since the change in temperature of the IC due to the change in ambient temperature is big, the temperature compensation circuit 10 generates the temperature compensation voltage TC based on the output signal of the temperature sensor 13, which is disposed inside the oscillating IC 6 separately from the temperature sensor 50, and more accurately detects the temperature of the oscillating IC 6, to thereby correct the frequency deviation caused mainly by the change in temperature of the IC. Thus, the frequency stability higher than that of the related-art OCXO can be realized.

Figure 5:
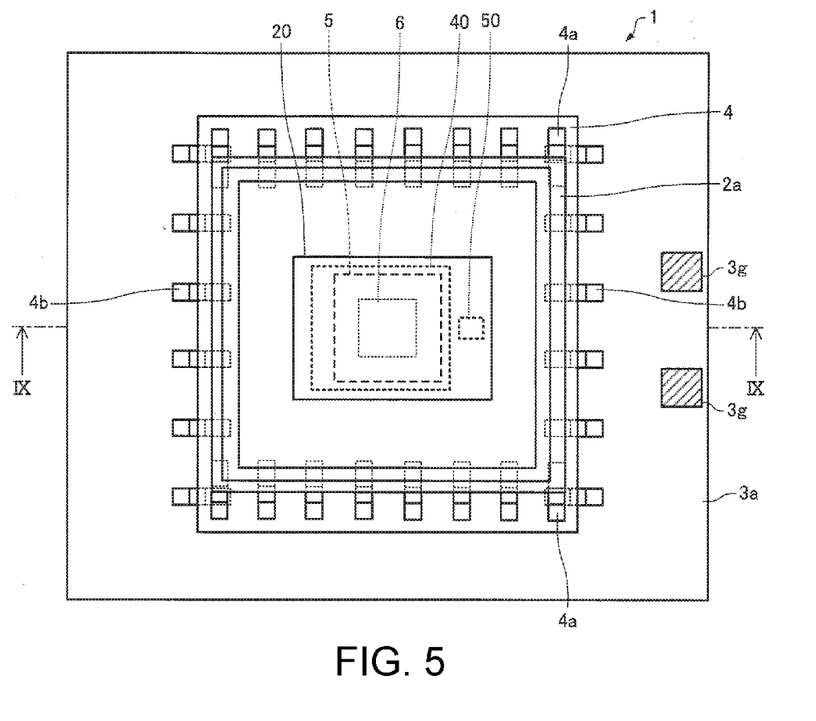
FIG. 5 is a plan view schematically showing the oscillator according to the first embodiment.
Figure 6:
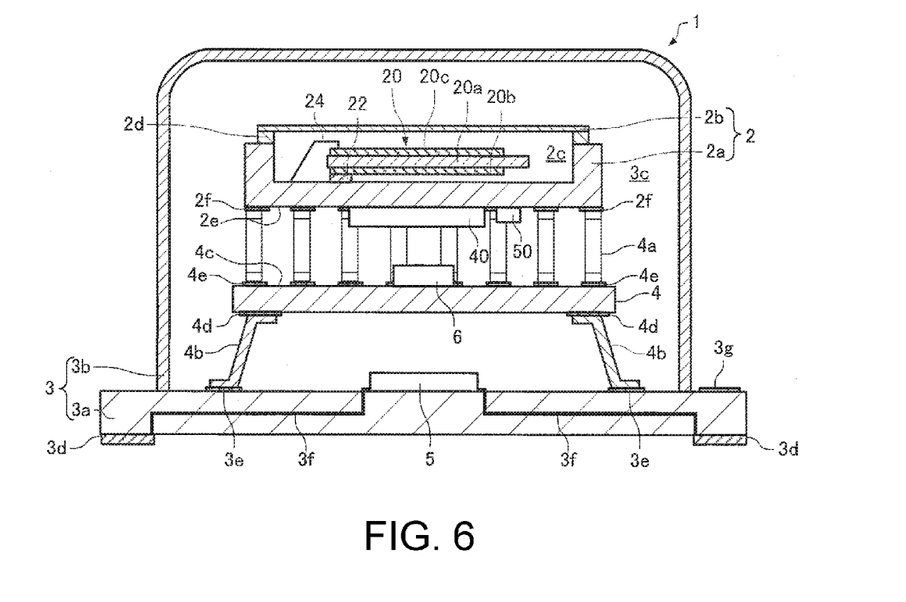
FIG. 6 is a cross-sectional view schematically showing the oscillator according to the first embodiment.

FIG. 5 is a plan view schematically showing the oscillator 1 according to the first embodiment. FIG. 6 is a cross-sectional view schematically showing the oscillator 1 according to the first embodiment, and is a cross-sectional view along the line IX-IX shown in FIG. 5.

As shown in FIG. 5 and FIG. 6, the oscillator 1 according to the present embodiment is configured further including a first container 2, a second container 3, a support substrate 4 (an example of a second substrate), first supports 4a, and second supports 4b.

As shown in FIG. 5 and FIG. 6, the first container 2 houses the resonator 20. It should be noted that the first container 2 can also house other members constituting the oscillator 1. The first container 2 is configured including a package 2a and a lid 2b. It should be noted that in FIG. 5, the lid 2b is omitted from the drawing for the sake of convenience.

The package 2a is, for example, a ceramic package. The package 2a is a ceramic stacked package formed by, for example, forming ceramic green sheets, then stacking the ceramic green sheets on one another, and then sintering the ceramic green sheets thus stacked. The package 2a has a recessed part, and the resonator 20 is housed in a space (a housing chamber) 2c in the recessed part. In the example shown in the drawing, an opening part is disposed in an upper part of the package 2a, and by covering the opening part with the lid 2b, the housing chamber 2c is formed. The housing chamber 2c is in, for example, a reduced-pressure atmosphere (a vacuum state). It should be noted that the housing chamber 2c can also be in the atmosphere of an inert gas such as nitrogen, argon, or helium.

It should be noted that although not shown in the drawings, the package 2a is provided with electrodes electrically connected respectively to excitation electrodes 20b, 20c of the resonator 20, interconnections for electrically connecting terminals disposed on the lower surface of the package 2a and the resonator 20 to each other, and so on.

The lid 2b covers the opening part of the package 2a. The shape of the lid 2b is, for example, a plate-like shape. As the lid 2b, there is used, for example, a plate member (e.g., a ceramics plate) made of the same material as that of the package 2a, or a metal plate made of Kovar, 42-alloy, stainless steel, or the like. The lid 2b is connected to the package 2a via a bonding member 2d such as a sealing ring, low melting point glass, or an adhesive.

In the oscillator 1, the temperature control element 40 performs the control so as to keep the temperature of the inside (the inside of the thermostatic oven) of the first container 2 constant using the inside (the space (the housing chamber 2c) formed in the first container 2) of the first container 2 as the thermostatic oven (the oven).

The resonator 20 is housed inside the first container 2. The resonator 20 is mounted on (disposed in) the package 2a. In the example shown in the drawing, the resonator 20 is bonded on the package 2a via a bonding member 22. As the bonding member 22, there can be cited, for example, solver paste, solder, and an electrically-conductive adhesive (an adhesive having electrically-conductive filler such as metal particles dispersed in a resin material).

The resonator 20 is, for example, an SC-cut quartz crystal resonator. The resonator 20 has a quartz crystal substrate 20a, and the excitation electrodes 20b, 20c. It should be noted that in FIG. 5, the resonator 20 is illustrated in a simplified manner for the sake of convenience.

As the quartz crystal substrate 20a, an SC-cut quartz crystal substrate (a piezoelectric substrate) is used. The planar shape (the shape viewed from the thickness direction of the quartz crystal substrate 20a) of the quartz crystal substrate 20a is, for example, a circle, an ellipse, or a polygon such as a quadrangle.

The first excitation electrode 20b and the second excitation electrode 20c are disposed across the quartz crystal substrate 20a from each other. The excitation electrodes 20b, 20c apply a voltage to the quartz crystal substrate 20a to vibrate the quartz crystal substrate 20a.

The first excitation electrode 20b is disposed on the lower surface of the quartz crystal substrate 20a. The first excitation electrode 20b is electrically connected to an electrode not shown disposed on the package 2a via an extraction electrode disposed on the lower surface of the quartz crystal substrate 20a and the bonding member 22.

The second excitation electrode 20c is disposed on the upper surface of the quartz crystal substrate 20a. The second excitation electrode 20c is electrically connected to an electrode (not shown) disposed on the package 2a via an extraction electrode disposed on the upper surface of the quartz crystal substrate 20a and a bonding wire 24. It should be noted that in FIG. 5, the illustration of the bonding wire 24 is omitted for the sake of convenience. As the excitation electrodes 20b, 20c, there is used, for example, a structure obtained by stacking chromium and gold in this order from the quartz crystal substrate 20a side.

The temperature control element 40 is disposed on the outer surface 2e of the first container 2. The outer surface 2e of the first container 2 on which the temperature control element 40 is disposed is the lower surface of the package 2a, and is a surface opposed to a principal surface 4c (the upper surface of the support substrate 4) of the support substrate 4. The temperature control element 40 is bonded to the outer surface 2e of the first container 2 with a bonding member (not shown) such as resin.

The temperature control element 40 is, for example, a heater, and it is also possible to use an element (e.g., a power transistor or a resistor) generating heat by making a current flow therethrough. The temperature control element 40 controls the temperature (the temperature of the resonator 20) of the inside of the first container 2. The temperature control element 40 is controlled by the temperature control circuit 60 so that the temperature of the inside (the housing chamber 2c) of the first container 2 becomes constant (or roughly constant).

The temperature sensor 50 is disposed on the outer surface 2e of the first container 2. The temperature sensor 50 is disposed on the outer surface 2e of the first container opposed to the support substrate 4 together with the temperature control element 40. The temperature sensor 50 is bonded to the outer surface 2e of the first container 2 with a bonding member (not shown) such as resin.

It should be noted that although in the example shown in the drawings, the temperature control element 40 and the temperature sensor 50 are disposed on the outer surface 2e of the first container 2 as elements separated from each other, it is also possible for the temperature control element 40 (e.g., a power transistor) and the temperature sensor 50 to constitute a single semiconductor element, and it is also possible for the semiconductor element to be disposed on the outer surface 2e of the first container 2.

Further, on the outer surface 2e of the first container 2, there are disposed electrodes 2f for electrically connecting the oscillating IC 6, and the resonator 20, the temperature control element 40, or the temperature sensor 50 to each other.

The second container 3 is configured including a base substrate 3a (an example of the first substrate) and a cover 3b. It should be noted that in FIG. 5, the cover 3b is omitted from the illustration for the sake of convenience.

The cover 3b is put on the base substrate 3a to form a space 3c together with the base substrate 3a. The material of the cover 3b is, for example, metal or resin. As the cover 3b, it is also possible to use an iron-type alloy low in thermal conductivity provided with nickel plating such as a 42-alloy (iron nickel alloy). The cover 3b is fixed to the upper surface of the base substrate 3a with solder or the like. The space 3c is in, for example, a reduced-pressure atmosphere (a vacuum state). It should be noted that the space 3c can also be in the atmosphere of an inert gas such as nitrogen, argon, or helium, or can be exposed to the atmosphere. In the space 3c (the inside of the second container 3), there are housed the first container 2, the support substrate 4, the first supports 4a, the second supports 4b, the D/A conversion IC 5, the oscillating IC 6, the temperature control element 40, and the temperature sensor 50. It should be noted that although not shown in the drawings, in the space 3c (the inside of the second container 3), there are also housed the variable-capacitance element 7, the variable-capacitance element 8, and other electronic components (e.g., resistors, capacitors, and coils).

The base substrate 3a is formed of a material having an insulating property such as glass epoxy resin or ceramics. On the lower surface of the base substrate 3a, there are disposed external terminals 3d for electrically connecting the elements housed inside the second container 3 and an external device and so on to each other.

On the upper surface of the base substrate 3a, there is disposed (mounted) the D/A conversion IC 5. The terminals of the temperature control element 40 and the temperature sensor 50 are electrically connected respectively to the terminals of the D/A conversion IC 5 or the oscillating IC 6 with wiring patterns not shown. It should be noted that the electronic components (e.g., resistors, capacitors, and coils) not shown are also disposed (mounted) on the base substrate 3a, and the terminals of these electronic components are electrically connected respectively to the terminals of the D/A conversion IC 5 or the oscillating IC 6 with wiring patterns not shown.

Further, the base substrate 3a has interconnections 3f for electrically connecting the terminals of the D/A conversion IC 5 and the corresponding external terminals 3d respectively to each other. The interconnections 3f are electrically connected to the digital interface circuit 90 (see FIG. 1) of the D/A conversion IC 5, and when the oscillator oscillates in the state of being incorporated in the electronic apparatus or the like, it is possible for the external device such as the control device to access the D/A conversion circuit 80 (see FIG. 1) from the external terminal 3d via the digital interface circuit 90. In the example shown in the drawings, the interconnections 3f are disposed in an inner layer of the base substrate 3a. It should be noted that each of the external terminals 3d electrically connected to the digital interface circuit 90 corresponds to the external terminal 1a shown in FIG. 1.

Further, the base substrate 3a has external terminals 3g. The external terminals 3g are electrically connected respectively to the terminals of the digital interface circuit 92 (see FIG. 1) of the oscillating IC 6 via the wiring patterns not shown. For example, in the case in which the digital interface circuit 92 is an interface circuit compatible with the I²C bus, the base substrate 3a is provided with two external terminals 3g corresponding respectively to the input terminal of the serial clock signal and the input/output terminal of the serial data signal as in the example shown in the drawing. It should be noted that unlike the external terminal 3d, in the case in which the oscillator oscillates in the state of being incorporated in the electronic apparatus, the external terminals 3g are not electrically connected to the external device such as the control device, and therefore, the external device cannot access the memory 100 (see FIG. 1) via the digital interface circuit 92. The external terminals 3g are terminals with which an adjustment device makes probes have contact to access the memory 100 via the digital interface circuit 92. It should be noted that each of the external terminals 3g corresponds to the external terminal 1b shown in FIG. 1.

Further, on the upper surface of the base substrate 3a, there are disposed electrodes 3e for electrically connecting the D/A conversion IC 5 or the external terminals 3d and the oscillating IC 6 to each other.

The support substrate 4 is mounted on the base substrate 3a via the second supports 4b. The support substrate 4 is supported by the second supports 4b to thereby be separated from the base substrate 3a. Specifically, there exists a gap between the support substrate 4 and the base substrate 3a, and the support substrate 4 and the base substrate 3a do not have contact with each other. The support substrate 4 is, for example, a plate-like member. The material of the support substrate 4 is, for example, ceramics or glass epoxy resin.

On the support substrate 4, there is mounted the first container 2 via the first supports 4a. The first container 2 is supported by the first support 4a to thereby be separated from the support substrate 4. Specifically, there exists a gap between the support substrate 4 and the first container 2 (the package 2a), and the support substrate 4 and the first container 2 (the package 2a) do not have contact with each other.

As described above, the support substrate 4 is disposed between the first container 2 (the package 2a) and the base substrate 3a. In other words, the support substrate 4 is disposed between the resonator 20 and the base substrate 3a.

On the upper surface of the support substrate 4, there are mounted at least a part of the oscillation circuit 30 (see FIG. 1) and at least a part of the operation state signal generation circuit 110 (see FIG. 1). In the example shown in the drawing, on the upper surface of the support substrate 4 there is mounted (disposed) the oscillating IC 6 including the oscillating circuit 32 (see FIG. 1) as a part of the oscillation circuit 30 and the whole of the operation state signal generation circuit 110. The oscillating IC 6 is disposed on the principal surface 4c of the support substrate 4 opposed to the outer surface 2e of the first container 2, on which the temperature control element 40 is disposed. The oscillating IC 6 is disposed, for example, so as to overlap the temperature control element 40 in a planar view. The oscillating IC 6 is preferably disposed in the vicinity of the temperature control element 40. It should be noted that on the support substrate 4, there are also disposed (mounted) the variable-capacitance element 7 and the variable-capacitance element 8 not shown, and the terminals of these elements are electrically connected respectively to the corresponding terminals of the D/A conversion IC 5 or the oscillating IC 6 with wiring patterns not shown. Further, other members constituting the oscillator 1 can also be mounted. Although not shown in the drawings, the support substrate 4 is provided with interconnections (e.g., interconnections for electrically connecting the oscillating IC 6 and the D/A conversion IC 5 to each other, and interconnections for supplying the power supply voltage VCC to the oscillating IC 6 from the outside of the oscillator 1) electrically connected to the elements mounted on the support substrate 4, and so on.

Further, on the upper surface of the support substrate 4, there are disposed electrodes 4e for electrically connecting the oscillating IC 6, and the resonator 20, the temperature control element 40, or the temperature sensor 50 to each other. Further, on the lower surface of the support substrate 4, there are disposed electrodes 4d for electrically connecting the D/A conversion IC 5 or the external terminals 3d and the oscillating IC 6 to each other.

The first supports 4a are disposed on the support substrate 4, and support the first container 2. There is disposed a plurality of (16 in the example shown in the drawings) first supports 4a, and the first container 2 is supported by the plurality of first supports 4a. The first container 2 is supported by the first support 4a to thereby be separated from the support substrate 4.

The second supports 4b are disposed on the base substrate 3a, and support the support substrate 4. There is disposed a plurality of (12 in the example shown in the drawings) second supports 4b, and the support substrate 4 is supported by the plurality of second supports 4b.

The first supports 4a are each an electrically-conductive member, and each have both ends respectively fixed by bonding to the electrode 4e disposed on the upper surface of the support substrate 4 and the electrode 2f disposed on the outer surface 2e of the first container 2. The electrodes 2f and the electrodes 4e are electrically connected to each other by the first supports 4a, respectively, and thus, the oscillating IC 6, and the resonator 20, the temperature control element 40, or the temperature sensor 50 are electrically connected to each other.

The second supports 4b are each an electrically-conductive member, and each have both ends respectively fixed by bonding to the electrode 3e formed on the outer surface of the base substrate 3a and the electrode 4d formed on the outer surface of the support substrate 4. The electrodes 3e and the electrodes 4d are electrically connected to each other by the second supports 4b, respectively, and thus, the D/A conversion IC 5 or the external terminals 3d, and the oscillating IC 6 are electrically connected to each other.

Further, the thermal conductivity of the second supports 4b is lower than the thermal conductivity of the first supports 4a. Thus, it is possible to make the second supports 4b harder to conduct heat compared to the first supports 4a. For example, either one of gold, copper, tungsten, silver, and aluminum, or an alloy including one or more of these metals is used as the material of the first supports 4a, and either one of iron, titanium, and platinum or an alloy including one or more of these metals is used as the material of the second supports 4b. In particular, a copper-type material is preferable as the material of the first supports 4a, and it is preferable to use Kovar or 42-alloy as the iron-type alloy as the material of the second supports 4b.

In the oscillator 1 according to the present embodiment, the heat generated in the temperature control element 40 transfers to the package 2a, and then transfers to the resonator 20 via the package 2a and the bonding member 22. Thus, the resonator 20 and the inside of the first container 2 are heated. Further, the heat generated in the temperature control element 40 transfers to the oscillating IC 6 via the package 2a, the support 4a, and the support substrate 4. Further, the heat generated in the temperature control element 40 transfers to the oscillating IC 6 via the space between the temperature control element 40 and the oscillating IC 6 as a radiation heat. As described above, the heat generated in the temperature control element 40 transfers to the oscillating IC 6 due to the heat conduction and the radiation, and thus, the oscillating IC 6 is heated. Since the temperature control element 40 is controlled by the temperature control circuit 60 so as to keep the temperature constant, the temperature of the resonator 20 and the temperature of the oscillating IC 6 are kept constant (roughly constant).

It should be noted that in the example shown in the drawings, the oscillating IC 6 is mounted on the support substrate 4, and is therefore hard to be affected by the ambient temperature of the oscillator 1. Therefore, the change in temperature of the oscillating IC 6 due to the change in ambient temperature of the oscillator 1 is small, and the temperature difference between the oscillating IC 6 and the resonator 20 is also small. It is also possible to use the temperature sensor 50 for both of the temperature control by the temperature control circuit 60 and the temperature compensation by the temperature compensation circuit 10. In this case, since the temperature sensor 13 (see FIG. 1) of the oscillating IC 6 is unnecessary, there is an advantage in reduction in manufacturing cost and reduction in size.

According to the oscillator 1 related to the first embodiment described hereinabove, since the oscillation circuit 30 is disposed outside the D/A conversion IC 5, it is hard for the noise caused by the digital signal (the communication signal) for controlling the frequency input via the digital interface circuit 90 of the D/A conversion IC 5 to get mixed in the oscillation circuit 30 through a roundabout way, and thus it is possible to reduce the possibility that the noise characteristic of the oscillation signal VO is deteriorated by the communication signal.

Further, according to the oscillator 1 related to the first embodiment, since the D/A conversion IC 5 has the terminal 5a to which the operation state signal is input, it is possible to output the operation state signal (the oven alarm signal OA) to the outside via the digital interface circuit 90 of the D/A conversion IC 5. Further, since the oscillation circuit 30 is disposed outside the D/A conversion IC 5, it is hard for the noise caused by the digital signal (the communication signal), which requests the output of the operation state signal, and is input via the digital interface circuit 90 of the D/A conversion IC 5, and the noise caused by the digital signal corresponding to the operation state signal output via the digital interface circuit 90 to get mixed in the oscillation circuit 30 through a roundabout way, and it is possible to further reduce the possibility that the noise characteristic of the oscillation signal VO is deteriorated by the communication signal.

Further, according to the oscillator 1 related to the first embodiment, a variety of types of configuration information is stored in the memory 100 via the digital interface circuit 92 of the oscillating IC 6 before the oscillation circuit 30 starts the oscillation to thereby improve the characteristic of the oscillation signal VO, and there is no chance for the operation state signal to be read out via the digital interface circuit 92 of the oscillating IC 6 after the oscillation circuit 30 has started the oscillation. Therefore, it is possible to reduce the possibility that the noise characteristic of the oscillation signal VO is deteriorated by the noise caused by the communication signal.

Further, according to the oscillator 1 related to the first embodiment, since the oscillating IC 6 is mounted on the support substrate 4 different from the base substrate 3a on which the D/A conversion IC 5 is mounted, it is hard for the noise generated by the digital signal (the communication signal) propagating through the interconnections 3f (the digital interconnections) disposed on the base substrate 3a to get mixed in the oscillation circuit 30 through a roundabout way, and thus, it is possible to further reduce the possibility that the noise characteristic of the oscillation signal VO is deteriorated.

Further, according to the oscillator 1 related to the first embodiment, since the support substrate 4 on which the oscillating IC 6 is mounted is disposed between the resonator 20 and the base substrate 3a, the interconnections connecting the resonator 20 and the oscillating IC 6 mounted on the support substrate 4 to each other are shortened to thereby improve the noise characteristic of the oscillation signal VO, and the interconnections connecting the oscillating IC 6 and the first integrated circuit mounted on the base substrate 3a to each other are shortened, which is advantageous to the miniaturization.

1-2. Second Embodiment

Since the functional block diagram of the oscillator 1 according to the second embodiment is substantially the same as shown in FIG. 1, the illustration and the description thereof will be omitted. Further the plan view of the oscillator 1 according to the second embodiment is substantially the same as shown in FIG. 5, the illustration and the description thereof will be omitted.

Figure 7:
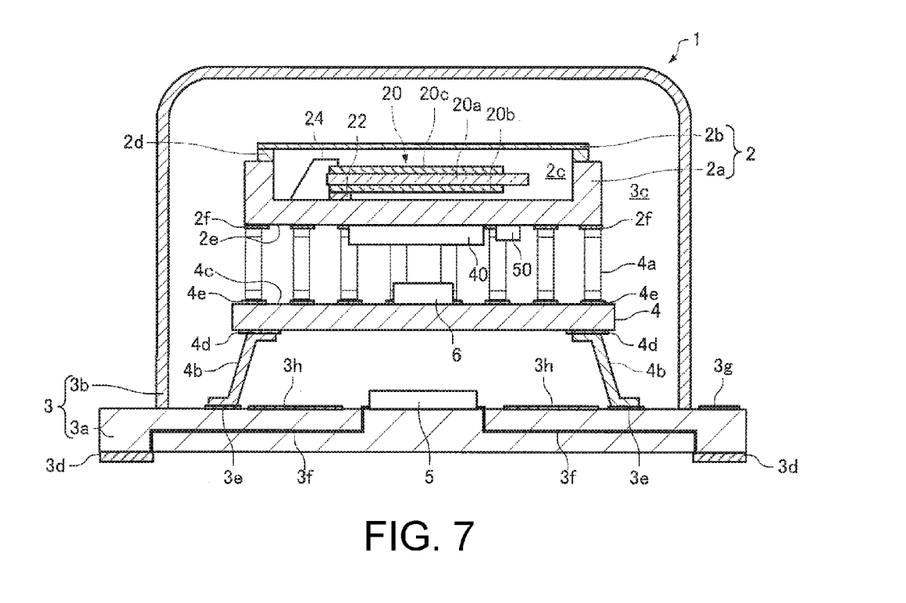
FIG. 7 is a cross-sectional view schematically showing an oscillator according to second embodiment.
Figure 8:
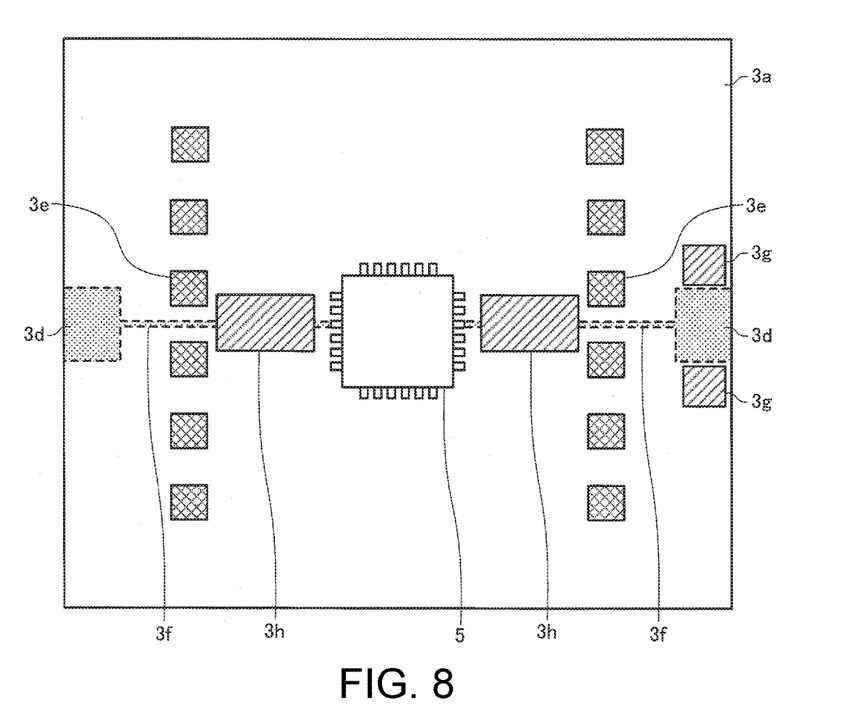
FIG. 8 is a plan view of a base substrate in the oscillator according to the second embodiment.

FIG. 7 is a cross-sectional view schematically showing the oscillator 1 according to the second embodiment, and is a cross-sectional view along the line IX-IX shown in FIG. 5. Further, FIG. 8 is a plan view of a base substrate 3a in the oscillator 1 according to the second embodiment. In the oscillator 1 according to the second embodiment, substantially the same constituents as those of the oscillator 1 according to the first embodiment are denoted by the same reference symbols, and the description thereof will be omitted. It should be noted that in FIG. 8, illustration of a part such as interconnections or elements unnecessary in the following description will be omitted.

As shown in FIG. 7 and FIG. 8, the oscillator 1 according to the second embodiment has substantially the same structure as that of the oscillator 1 according to the first embodiment, and is further provided with shield patterns 3h disposed on the upper surface of the base substrate 3a. The two external terminals 3d drawn by the dotted lines in FIG. 8 are the external terminals to be connected to the digital interface circuit 90. For example, in the case in which the digital interface circuit 90 is an interface circuit compatible with the I²C bus, one of the external terminals 3d corresponds to the input terminal of the serial clock signal, and the other of the external terminal 3d corresponds to the input/output terminal of the serial data signal. Further, the two external terminals 3d and the two terminals of the D/A conversion IC 5 are electrically connected to each other with the two interconnections 3f illustrated with the dotted lines, respectively. In other words, the interconnections 3f are the interconnections through which the communication signal as the digital signal propagates. The shield patterns 3h are wiring patterns for shielding the noise generated by the communication signal propagating through the interconnections 3f, and are electrically connected to the ground with interconnections not shown. It should be noted that the shield patterns 3h can also be a part of a ground pattern of the oscillator 1. Further, the shield patterns 3h can be disposed in an inner layer (an upper layer of the interconnections 3f) instead of the upper surface of the base substrate 3a.

As shown in FIG. 8, in the planar view of the base substrate 3a, at least apart of the shield pattern 3h overlaps the interconnection 3f (the digital interconnection). Specifically, the shield patterns 3h are disposed between the support substrate 4 on which the oscillating IC 6 is mounted and the interconnections 3f. Therefore, according to the oscillator 1 related to the second embodiment, since it is harder for the noise generated by the communication signal propagating through the interconnections 3f to get mixed in the oscillation circuit 30 through a roundabout way due to the shield patterns 3h compared to the oscillator 1 according to the first embodiment, there is obtained an advantage that it is possible to further reduce the possibility that the noise characteristic of the oscillation signal VO is deteriorated in addition to substantially the advantage of the oscillator 1 according to the first embodiment.

1-3. Modified Examples

The temperature control element 40 and the temperature sensor 50 are separated from each other in each of the embodiments described above, but can also be integrated with each other. Further, it is also possible that at least either one of the temperature control element 40 and the temperature sensor 50 is integrated with the oscillating IC 6.

Further, the oscillator 1 is a so-called surface-mount type oscillator in which the external terminal 3d to be connected to the external device are disposed on the lower surface of the base substrate 3a in each of the embodiments described above, but can also be a so-called pin-type oscillator having columnar metal pins as the external terminals.

Further, although in each of the embodiments described above, the oscillating IC 6 has the digital interface circuit 92 for the purpose of storing the information for adjusting the characteristic to the memory 100, in the case in which, for example, there is no need to adjust the characteristic of the oscillating IC 6, it is not required to have the digital interface circuit 92 and the terminals (terminals for communication) for accessing the digital interface circuit 92. In this case, since there is no chance for the communication signal to erroneously be input to the oscillating IC 6 while the oscillator 1 is oscillating, it is possible to further reduce the possibility that the noise characteristic of the oscillation signal VO is deteriorated by the communication signal.

Further, although the oscillator 1 of each of the embodiments described above is the oven controlled oscillator having the temperature compensation function, an oven controlled oscillator without the temperature compensation function (not provided with the temperature compensation circuit 10) can also be adopted. Further, the oscillator 1 is not required to be the oven controlled oscillator, but can also be, for example, a temperature compensated oscillator (e.g., a temperature compensated crystal oscillator (TCXO)) having the temperature compensation function, a voltage controlled oscillator (e.g., voltage controlled crystal oscillator (VCXO)) having a frequency control function, or an oscillator (e.g., a voltage controlled temperature compensated crystal oscillator (VC-TCXO)) having the temperature compensation function and the frequency control function.

2. Electronic Apparatus

Figure 9:
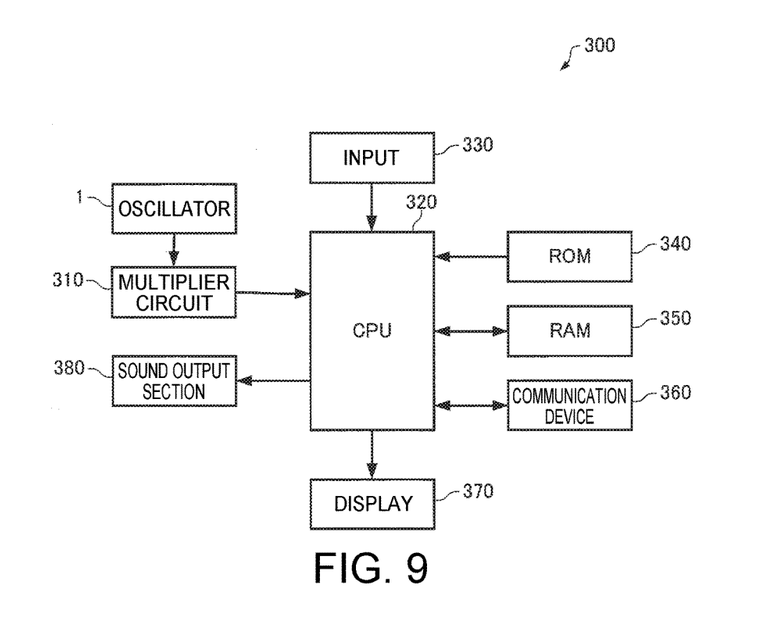
FIG. 9 is a functional block diagram showing an example of a configuration of an electronic apparatus according to an embodiment.

FIG. 9 is a functional block diagram of an electronic apparatus 300 according to the present embodiment. It should be noted that the constituents substantially the same as those of the embodiments and the modified examples described above are denoted by the same reference symbols, and the detailed description thereof will be omitted.

The electronic apparatus 300 according to the present embodiment is an electronic apparatus 300 including the oscillator 1. In the example shown in FIG. 9, the electronic apparatus 300 is configured including the oscillator 1, a multiplier circuit 310, a central processing unit (CPU) 320, an input 330, a read only memory (ROM) 340, a random access memory (RAM) 350, a communication device 360, a display 370, and a sound output 380. It should be noted that the electronic apparatus 300 according to the present embodiment can also have a configuration obtained by eliminating or modifying some of the constituents (the sections) shown in FIG. 9, or adding other constituents.

The oscillator 1 is for outputting the oscillation signal with the specified frequency, and has the configuration, for example, described in each of the embodiments or each of the modified examples described above.

The multiplier circuit 310 supplies clock pulses not only to the CPU 320 but also to each of the sections (not shown). The clock pulses can also be a signal obtained by taking out a specified harmonic signal from the oscillation signal from the oscillator 1 using the multiplier circuit 310, or can also be a signal obtained by multiplying the oscillation signal from the oscillator 1 using the multiplier circuit 310 including a PLL synthesizer (not shown).

The CPU 320 performs a variety of arithmetic processes and control processes using the clock pulses output by the multiplier circuit 310 in accordance with the programs stored in the ROM 340 and so on. Specifically, the CPU 320 performs a variety of processes corresponding to the operation signal from the input 330, a process of controlling the communication device 360 for performing data communication with external devices, a process of transmitting a display signal for making the display 370 display a variety of types of information, a process of making the sound output 380 output a variety of sounds, and so on.

The input 330 is an input device constituted by operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the input 330, and the arithmetic result obtained by the CPU 320 performing operations in accordance with the variety of programs.

The communication device 360 performs a variety of types of control for achieving the data communication between the CPU 320 and the external devices.

The display 370 is a display device formed of a liquid crystal display (LCD), an electrophoretic display, or the like, and displays a variety of types of information based on the display signal input from the CPU 320.

The sound output 380 is a device, such as a speaker, for outputting sounds.

According to the electronic apparatus 300 related to the present embodiment, since there is provided the oscillator 1 capable of reducing the possibility that the noise characteristic of the oscillation signal is deteriorated by the communication signal, it is possible to realize the electronic apparatus 300 higher in reliability.

As such an electronic apparatus 300, a variety of electronic apparatuses can be adopted, and there can be cited, for example, a GPS (global positioning system) module, a network apparatus, a broadcast apparatus, a communication apparatus used in an artificial satellite or a base station, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS (point of sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Figure 10:
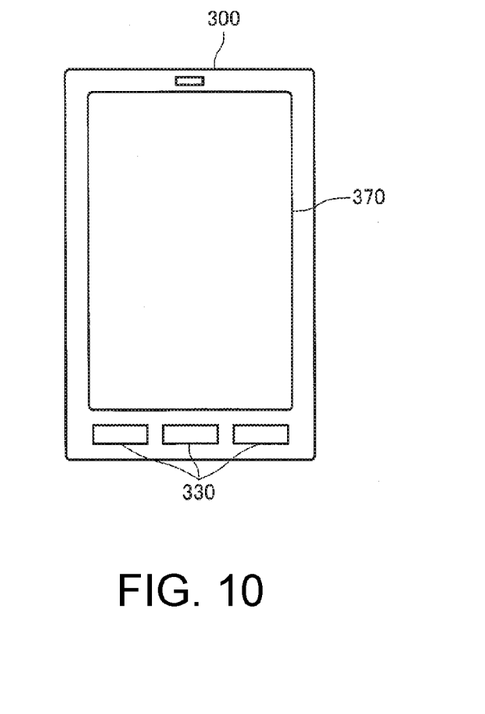
FIG. 10 is a diagram showing an example of an appearance of the electronic apparatus according to the embodiment.

FIG. 10 is a diagram showing an example of an exterior appearance of a smartphone as an example of the electronic apparatus 300. The smartphone as the electronic apparatus 300 is provided with buttons as the inputs 330, and an LCD as the display 370. Further, since the smartphone as the electronic apparatus 300 related to the present embodiment is provided with the oscillator 1 capable of reducing the possibility that the noise characteristic of the oscillation signal is deteriorated by the communication signal, it is possible to realize the electronic apparatus 300 higher in reliability.

Further, as another example of the electronic apparatus 300 according to the present embodiment, there can be cited a transmission device using the oscillator 1 as a reference signal source, and functioning as, for example, a terminal base station device for performing communication with terminals wirelessly or with wire. By using the oscillator capable of reducing the possibility that the noise characteristic of the oscillation signal is deteriorated by the communication signal, it is also possible to realize the electronic apparatus 300 which can be used for, for example, a communication base station, which is higher in frequency accuracy than ever before, and for which high performance and high reliability are required.

Further, as another example of the electronic apparatus 300 according to the present embodiment, it is possible to adopt a communication device in which the communication device 360 receives an external clock signal, and the CPU 320 (the processor) includes a frequency controller for controlling the frequency of the oscillator 1 based on the external clock signal and one of the output signal of the oscillator 1 and the output signal of the multiplier circuit 310 (an internal clock signal). The communication device can be a communication apparatus used for, for example, a backbone network apparatus such as Stratum-3, or a femtocell.

3. Vehicle

Figure 11:
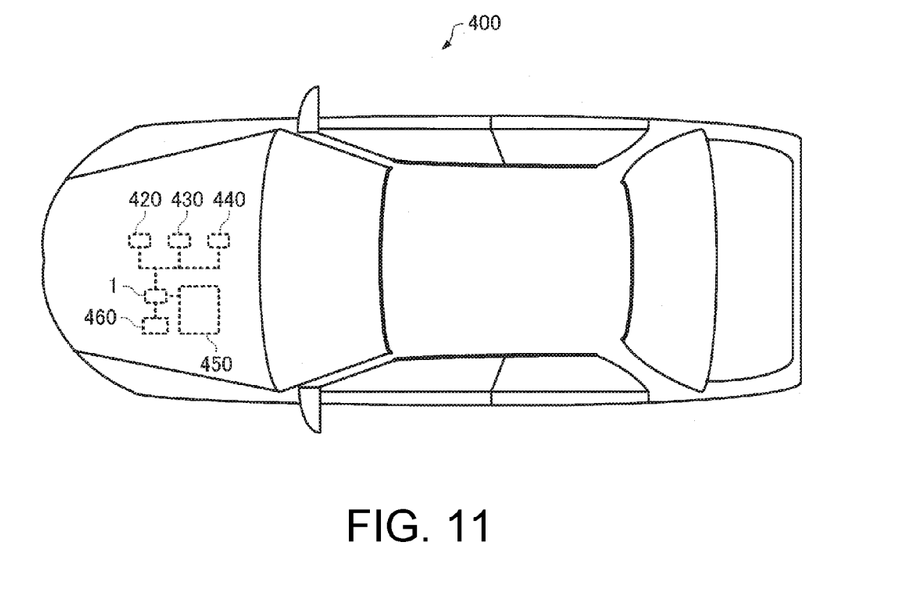
FIG. 11 is a diagram showing an example of a vehicle according to an embodiment.

FIG. 11 is a diagram (a top view) showing an example of a vehicle 400 according to the present embodiment. It should be noted that the constituents substantially the same as those of the embodiments and the modified examples described above are denoted by the same reference symbols, and the detailed description thereof will be omitted.

The vehicle 400 according to the present embodiment is a vehicle 400 including the oscillator 1. In the example shown in FIG. 11, the vehicle 400 is configured including controllers 420, 430, and 440 for performing control of a variety of systems such as an engine system, a brake system, and a keyless entry system, a battery 450, and a backup battery 460. It should be noted that the vehicle 400 according to the present embodiment can also have a configuration obtained by eliminating or modifying some of the constituents (the sections) shown in FIG. 11, or adding other constituents.

The oscillator 1 is for outputting the oscillation signal with the specified frequency, and has the configuration, for example, described in each of the embodiments or each of the modified examples described above. The oscillation signal is output from the external terminal of the oscillator 1 to the controllers 420, 430, and 440, and is used as, for example, a clock signal.

The battery 450 supplies the oscillator 1 and the controllers 420, 430, and 440 with electrical power. The backup battery 460 supplies the oscillator 1 and the controllers 420, 430, and 440 with the electrical power when the output voltage of the battery 450 drops to a level lower than a threshold value.

According to the vehicle 400 related to the present embodiment, since there is provided the oscillator 1 capable of reducing the possibility that the noise characteristic of the oscillation signal is deteriorated by the communication signal, it is possible to realize the vehicle 400 higher in reliability.

As such a vehicle 400, there can be adopted a variety of types of vehicles, and there can be cited a car (including an electric car), an aircraft such as a jet plane or a helicopter, a ship, a boat, a rocket, an artificial satellite, and so on.

The invention is not limited to the embodiments, but can be implemented with a variety of modifications within the scope or the spirit of the invention.

The embodiments described above are each illustrative only, and the invention is not limited thereto. For example, it is also possible to arbitrarily combine any of the embodiments and the modified examples with each other.

The invention includes configurations (e.g., configurations having the same function, the same way, and the same result, or configurations having the same object and the same advantage) substantially the same as the configuration described as one of the embodiments of the invention. Further, the invention includes configurations obtained by replacing a non-essential part of the configuration explained in the above description of the embodiments. Further, the invention includes configurations providing the same functions and the same advantages or configurations capable of achieving the same object as that of the configurations explained in the description of the embodiments. Further, the invention includes configurations obtained by adding a known technology to the configuration explained in the description of the embodiments.

What is claimed is:

1. An oscillator comprising:
a first integrated circuit comprising
a first digital interface circuit,
a D/A conversion circuit that converts a digital signal input via the first digital interface circuit into an analog signal to generate a frequency control signal, and
a terminal to which an operation state signal is input;
an oscillation circuit disposed outside of the first integrated circuit, the frequency control signal controlling a frequency of the oscillation circuit;
an operation state signal generation circuit disposed outside of the first integrated circuit, that generates the operation state signal based on an operation state of the oscillation circuit; and
a second integrated circuit including at least a part of the oscillation circuit and at least a part of the operation state signal generation circuit.

2. The oscillator according to claim 1, wherein the first integrated circuit outputs a signal based on the operation state signal via the first digital interface circuit.

3. The oscillator according to claim 1, further comprising:
a resonator,
wherein the oscillation circuit oscillates the resonator.

4. An oscillator comprising:
a first integrated circuit comprising
a first digital interface circuit,
a D/A conversion circuit that converts a digital signal input via the first digital interface circuit into an analog signal to generate a frequency control signal, and
a terminal to which an operation state signal is input;
an oscillation circuit disposed outside of the first integrated circuit, the frequency control signal controlling a frequency of the oscillation circuit;
an operation state signal generation circuit disposed outside of the first integrated circuit, that generates the operation state signal based on an operation state of the oscillation circuit; and
a resonator, wherein
the oscillation circuit oscillates the resonator, and
the operation state signal is a signal representing whether or not temperature of the resonator is in a predetermined state.

5. The oscillator according to claim 3, further comprising:
a temperature control element adapted to control temperature of the resonator.

6. An oscillator comprising:
a first integrated circuit comprising
a first digital interface circuit,
a D/A conversion circuit that converts a digital signal input via the first digital interface circuit into an analog signal to generate a frequency control signal, and
a terminal to which an operation state signal is input;
an oscillation circuit disposed outside of the first integrated circuit, the frequency control signal controlling a frequency of the oscillation circuit;
an operation state signal generation circuit disposed outside of the first integrated circuit, that generates the operation state signal based on an operation state of the oscillation circuit; and
a first substrate on which the first integrated circuit is mounted, wherein
the first substrate includes
a digital interconnection electrically connected to the first digital interface circuit, and
a shield pattern, and
at least a part of the shield pattern overlaps the digital interconnection in a planar view of the first substrate.

7. The oscillator according to claim 3, further comprising:
a first substrate on which the first integrated circuit is mounted, wherein
the first substrate includes
a digital interconnection electrically connected to the first digital interface circuit, and
a shield pattern, and
at least a part of the shield pattern overlaps the digital interconnection in a planar view of the first substrate.

8. The oscillator according to claim 7, further comprising:
a second substrate on which at least a part of the oscillation circuit and at least a part of the operation state signal generation circuit are mounted.

9. The oscillator according to claim 8, wherein the second substrate is disposed between the resonator and the first substrate.

10. The oscillator according to claim 1, wherein the second integrated circuit comprises
a second digital interface circuit, and
a memory that stores information based on a digital signal input via the second digital interface circuit.

11. The oscillator according to claim 10, wherein the operation state signal generation circuit and the second digital interface circuit are electrically isolated from each other.

12. The oscillator according to claim 10, further comprising:
a first external terminal; and
a second external terminal separated from the first external terminal, wherein
the first digital interface circuit is electrically connected to the first external terminal, and
the second digital interface circuit is electrically connected to the second external terminal.

13. An electronic apparatus comprising:
the oscillator according to claim 1.

14. A vehicle comprising:
the oscillator according to claim 1.

* * * * *